United States Patent
Lowgren

(10) Patent No.: US 9,117,990 B2
(45) Date of Patent: Aug. 25, 2015

(54) NANOWIRE LED STRUCTURE AND METHOD FOR MANUFACTURING THE SAME

(71) Applicant: GLO AB, Lund (SE)

(72) Inventor: Truls Lowgren, Palo Alto, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/166,308

(22) Filed: Jan. 28, 2014

(65) Prior Publication Data

US 2014/0141555 A1    May 22, 2014

Related U.S. Application Data

(62) Division of application No. 13/163,280, filed on Jun. 17, 2011, now Pat. No. 8,669,125.

(60) Provisional application No. 61/356,167, filed on Jun. 18, 2010.

(51) Int. Cl.
| | |
|---|---|
| H01L 33/38 | (2010.01) |
| H01L 33/62 | (2010.01) |
| B82Y 20/00 | (2011.01) |
| H01L 33/18 | (2010.01) |
| H01L 33/08 | (2010.01) |

(52) U.S. Cl.
CPC ............... *H01L 33/62* (2013.01); *B82Y 20/00* (2013.01); *H01L 33/18* (2013.01); *H01L 33/08* (2013.01); *H01L 33/38* (2013.01); *H01L 2924/0002* (2013.01); *Y10S 977/762* (2013.01)

(58) Field of Classification Search
CPC ...... H01L 33/38; H01L 33/62; Y10S 977/762
USPC .................................................. 438/22, 29
See application file for complete search history.

(56) References Cited

U.S. PATENT DOCUMENTS

| | | |
|---|---|---|
| 5,376,580 A | 12/1994 | Kish et al. |
| 6,194,743 B1 | 2/2001 | Kondoh et al. |
| 6,320,206 B1 | 11/2001 | Coman et al. |

(Continued)

FOREIGN PATENT DOCUMENTS

| | | |
|---|---|---|
| JP | H05-283741 | 10/1993 |
| JP | 2007-059921 | 3/2007 |

(Continued)

OTHER PUBLICATIONS

International Search Report & Written Opinion, International Application No. PCT/US2011/040932, Feb. 9, 2012.

(Continued)

*Primary Examiner* — Tran Tran
(74) *Attorney, Agent, or Firm* — The Marbury Law Group PLLC

(57) ABSTRACT

A light emitting diode (LED) structure includes a plurality of devices arranged side by side on a support layer. Each device includes a first conductivity type semiconductor nanowire core and an enclosing second conductivity type semiconductor shell for forming a pn or pin junction that in operation provides an active region for light generation. A first electrode layer extends over the plurality of devices and is in electrical contact with at least a top portion of the devices to connect to the shell. The first electrode layer is at least partly air-bridged between the devices.

18 Claims, 16 Drawing Sheets

(56) References Cited

U.S. PATENT DOCUMENTS

| | | |
|---|---|---|
| 6,420,199 B1 | 7/2002 | Coman et al. |
| 6,800,500 B2 | 10/2004 | Coman et al. |
| 6,812,502 B1 | 11/2004 | Chien et al. |
| 6,818,061 B2 | 11/2004 | Peczalski et al. |
| 7,125,734 B2 | 10/2006 | Sackrison et al. |
| 7,221,044 B2 | 5/2007 | Fan et al. |
| 7,274,040 B2 | 9/2007 | Sun |
| 7,335,908 B2 | 2/2008 | Samuelson et al. |
| 7,456,035 B2 | 11/2008 | Eliashevich et al. |
| 7,491,565 B2 | 2/2009 | Coman et al. |
| 7,569,941 B2 | 8/2009 | Majumdar et al. |
| 7,675,084 B2 | 3/2010 | Wierer et al. |
| 7,714,337 B2 | 5/2010 | Kim et al. |
| 7,718,449 B2 | 5/2010 | Gao et al. |
| 7,763,477 B2 | 7/2010 | Yuan et al. |
| 7,816,700 B2 | 10/2010 | Kim |
| 7,829,443 B2 | 11/2010 | Seifert et al. |
| 7,867,793 B2 | 1/2011 | Basin et al. |
| 7,871,839 B2 | 1/2011 | Lee et al. |
| 7,910,937 B2 | 3/2011 | Chen et al. |
| 7,919,780 B2 | 4/2011 | Lee |
| 7,960,260 B2 | 6/2011 | Samuelson et al. |
| 8,350,251 B1 | 1/2013 | Lowgren et al. |
| 2005/0227391 A1 | 10/2005 | Jin et al. |
| 2006/0131679 A1* | 6/2006 | Hantschel et al. ............ 257/415 |
| 2008/0012030 A1 | 1/2008 | Yoon et al. |
| 2008/0036038 A1* | 2/2008 | Hersee et al. ............... 257/615 |
| 2008/0135089 A1 | 6/2008 | Tsakalakos et al. |
| 2008/0179603 A1 | 7/2008 | Sakai et al. |
| 2009/0272971 A1 | 11/2009 | Lee et al. |
| 2010/0006817 A1 | 1/2010 | Ohlsson et al. |
| 2010/0059769 A1 | 3/2010 | Jeong |
| 2010/0109030 A1 | 5/2010 | Krames et al. |
| 2011/0240959 A1 | 10/2011 | Konsek et al. |
| 2011/0254034 A1 | 10/2011 | Konsek et al. |

FOREIGN PATENT DOCUMENTS

| | | |
|---|---|---|
| JP | 2008-098220 | 4/2008 |
| JP | 2009-152474 | 7/2009 |
| WO | WO2007/102781 A1 | 9/2007 |
| WO | WO2008/079079 A1 | 7/2008 |
| WO | WO2010/014032 A1 | 2/2010 |

OTHER PUBLICATIONS

International Preliminary Report on Patentability, International Application No. PCT/US2011/040932, Jan. 2, 2013.

Japanese Patent Office communication for JP. No. 2013-515558, dated Apr. 20, 2015.

* cited by examiner

NANOWIRE LED STRUCTURE AND METHOD FOR MANUFACTURING THE SAME

TECHNICAL FIELD OF THE INVENTION

The present invention relates to nanowire light emitting diodes structures, in particular arrays of nanowire light emitting devices and in particular to contacting thereof.

BACKGROUND OF THE INVENTION

Light emitting diodes (LEDs) are increasingly used for lighting, but still there are some technological challenges to overcome, in particular with regard to large-scale processing, in order to reach the real breakthrough.

Over recent years the interest in nanowire technology has increased. In comparison with LEDs produced with conventional planar technology nanowire LEDs offer unique properties due to the one-dimensional nature of the nanowires, improved flexibility in materials combinations due to less lattice matching restrictions and opportunities for processing on larger substrates. Suitable methods for growing semiconductor nanowires are known in the art and one basic process is nanowire formation on semiconductor substrates by particle-assisted growth or the so-called VLS (vapor-liquid-solid) mechanism, which is disclosed in e.g. U.S. Pat. No. 7,335,908. Particle-assisted growth can be achieved by use of chemical beam epitaxy (CBE), metalorganic chemical vapour deposition (MOCVD), metalorganic vapour phase epitaxy (MOVPE), molecular beam epitaxy (MBE), laser ablation and thermal evaporation methods. However, nanowire growth is not limited to VLS processes, for example the WO 2007/102781 shows that semiconductor nanowires may be grown on semiconductor substrates without the use of a particle as a catalyst. One important breakthrough in this field was that methods for growing group III-V semiconductor nanowires, and others, on Si-substrates have been demonstrated, which is important since it provides a compatibility with existing Si processing and non-affordable III-V substrates can be replaced by cheaper Si substrates.

One example of a bottom emitting nanowire LED is shown in WO 2010/14032. This nanowire LED comprises an array of semiconductor nanowires grown on a buffer layer of a substrate, such as a GaN buffer layer on a Si substrate. Each nanowire comprises an n-type nanowire core enclosed in a p-type shell and a p-electrode with an active layer formed between the n-type and p-type regions that form a pn or pin junction. The buffer layer has the function of being a template for nanowire growth as well as serving as a current transport layer connecting to the n-type nanowire cores. Further the buffer layer is transparent since the light that is generated in the active area is emitted through the buffer layer.

Although having advantageous properties and performance the processing with regard to contacting of the nanowire LEDs requires new routes as compared to planar technology. Since nanowire LEDs comprise large arrays of nanowires, thereby forming a three-dimensional surface with high aspect ratio structures, deposition of contact material using line-of-sight processes is a challenging operation.

SUMMARY OF THE INVENTION

In view of the foregoing one object of embodiments of the invention is to provide improved nanowire LEDs and new routes for contacting thereof.

This object is achieved by a semiconductor device and a method for forming a semiconductor device in accordance with the independent claims.

A nanowire light emitting diode (LED) structure in accordance with embodiments of the invention comprises nanowires arranged side by side. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed. A p-electrode layer extends over a plurality of nanowires and is in electrical contact with at least a top portion of the nanoelements to connect to the p-type shell. The p-electrode layer is at least partly air-bridged between the nanowires.

Traditional, planar LEDs comprise functional layers in a sandwich structure. In their simplest form, the planar LEDs comprise at least three functional layers: a p-doped layer, an active region, and an n-doped layer. Functional layers may also include wells, barriers, intrinsic and graded layers (e.g., as part of the active region). The LED arrays described in embodiments of the invention distinguish themselves by at least one of the functional layers being electrically separated from the surrounding LEDs in the array. Another distinguishing feature is the utilization of more than one facet and non-planarity of functional layers as emission layers.

Although the fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, as will be described below, in the alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

The use of sequential (e.g., shell) layers gives that the final individual device (e.g., a pn or pin device) may have a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

A method of manufacturing a nanowire LED structure in accordance with embodiments of the invention comprises the steps of:
 providing an array of semiconductor nanowires comprising a second conductivity type (e.g., p-type) region and a first conductivity type (e.g., n-type) region, the n-type region extending to the base of the nanowire;
 depositing a sacrificial layer that completely covers nanowires in a non-active area and partially covers nanowires in a LED area, leaving a top portion of the nanowires in the LED area exposed;

depositing a p-electrode on the exposed top portions; and removing the sacrificial layer to obtain an air-bridged p-electrode.

In prior art methods, arrays of nanowire LEDs are contacted by depositing a contact layer that covers essentially the whole surface of the nanowires and intermediate surfaces between the nanowires using sputtering or evaporation techniques. Due to the high aspect ratio, and often small spacing of the nanowires these line-of-sight processes results in a non-conformal coverage. In particular, there is a risk that the contact layer becomes discontinuous and that the contact layer on the intermediate surfaces (e.g., the horizontal surface exposed between vertical nanowires) becomes too thin. In operation, this will result in losing the effect of some nanowires and a poor current spreading in the device, respectively. With an air-bridged p-electrode in accordance with embodiments of the invention, the risk for discontinuities is reduced or eliminated, and the lateral current spreading is improved due to a uniform thickness of the p-electrode and optional additional layers deposited on the p-electrode.

One advantage of an air-bridge p-contact or electrode for top-emitting nanowire LEDs is that a thick contact layer can directly contact the top portion of the nanowire LED. For top emitting nanowire LEDs, a transparent p-contact layer is used. Without the air-bridge, the p-electrode layer at the nanowire top portion must be made much thicker, which increases absorption.

One advantage of the air-bridge p-contact or electrode for bottom-emitting nanowire LEDs is that the reflective p-contact layer is only arranged on the top portion of the nanowires and not the whole circumferential nanowire area. A reflective layer extending down on the whole circumferential area would give significant losses due to total internal reflection.

Thus, embodiments of the invention make it possible to obtain an efficient nanowire LED with regard to internal conductivity, light generation and coupling of light out from the nanowire LED.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

As used herein, the term "air-bridged electrode" is taken to mean an electrode structure that extends between adjacent individual devices to leave an empty space between the adjacent devices. The empty space is preferably surrounded by the adjacent devices on the sides, the air-bridged electrode on the "top" and the support of the devices on the "bottom", where the terms top and bottom are relative depending on which way the device is positioned. For example, in one embodiment in which each individual device is a radial core-shell nanowire, the air-bridged electrode covers the nanowire tips and the space between the nanowires, such that there is an empty space beneath the electrode between the nanowire support layer (e.g., substrate, buffer layer, a reflective or transparent conductive layer, insulating mask layer, etc.) and the electrode.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. Generally, nanowires with a polygonal cross section are considered to have at least two dimensions each of which are not greater than 300 nm. However, the nanowires can have a diameter or width of up to about 1 µm. The one dimensional nature of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature is often associated with an elongated shape. In other words, "one dimensional" refers to a width or diameter less than 1 micron and a length greater than 1 micron. Since nanowires may have various cross-sectional shapes, the diameter is intended to refer to the effective diameter. By effective diameter, it is meant the average of the major and minor axis of the cross-section of the structure.

Figure 1:
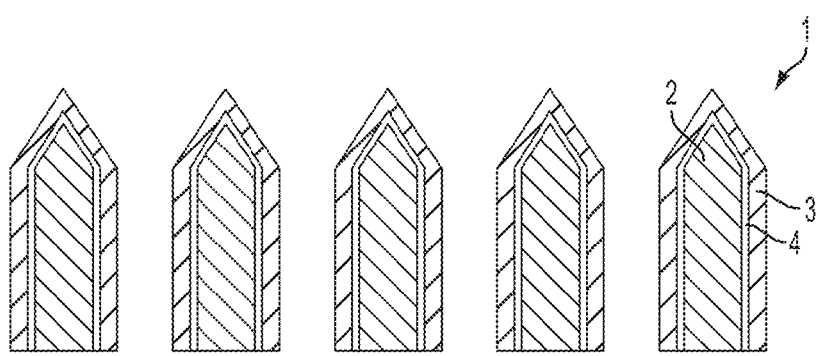
FIG. 1 schematically illustrates a side cross sectional view of a basis of a nanowire LED in accordance with embodiments of the invention, FIG. 2 schematically illustrates a side cross sectional view of a nanowire LED structure on a buffer layer in accordance with embodiments of the invention, FIGS. 3a-b schematically illustrate side cross sectional views of air-bridged p-electrodes in accordance with embodiments of the invention, FIGS. 4a-h schematically illustrate side cross sectional views of a first implementation of a method in accordance with one embodiment of the invention, FIGS. 4i-s schematically illustrate side cross sectional views of a second implementation of a method in accordance with another embodiment of the invention.

FIG. 1 schematically illustrates the basis for a nanowire LED structure in accordance with embodiments of the invention. In principle, one single nanowire is enough for forming a nanowire LED, but due to the small size, nanowires are preferably arranged in arrays comprising thousands of nanowires (i.e., nano-devices or devices) side by side to form the LED structure. For illustrative purposes the individual nanowire LED devices will be described herein as being made up from nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. As described above, in alternative embodiments, only the core 2 may comprise a nanostructure or nanowire by having a width or diameter below 1 micron, while the shell 3 may have a width or diameter above one micron. In order to function as a LED, the n-side and p-side of each nanowire 1 has to be contacted.

By growing the nanowires 1 on a growth substrate 5, optionally using a growth mask 6 (e.g., a nitride layer, such as silicon nitride dielectric masking layer) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. In one embodiment, the nanowires 1 are grown directly on the growth substrate 5.

Figure 2:
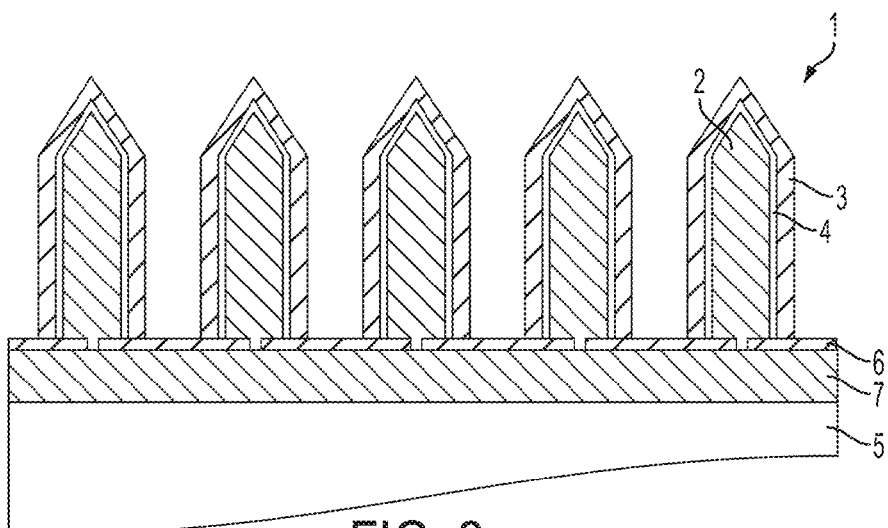

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 2, by way of example a III-nitride layer, such as a GaN and/or AlGaN buffer layer 7 on a Si substrate 5. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. It should be noted that the nanowire 1 may comprise several different materials (e.g., GaN core, InGaN active layer and InGaN shell having a different In to Ga ratio than the active layer). In general the substrate 5 and/or the buffer layer 7 are referred to herein as a support or a support layer for the nanowires. As will be described in more detail with regard to FIGS. 9-12, a conductive layer (e.g., a mirror or transparent contact) may be used as a support instead of or in addition to the substrate 5 and/or the buffer layer 7. Thus, the term "support layer" or "support" may include any one or more of these elements.

Thus, the buffer layer 7 provides means for contacting the n-side of the nanowires 1. In prior art nanowire LEDs, the contacting of the p-side of each nanowire 1 is typically accomplished by depositing a p-electrode comprising a conductive layer that encloses the p-type shell 3 of each nanowire 1 and extends to an insulating layer on the substrate or buffer layer. The conductive layer extends on this insulating layer to adjacent nanowires. However, since the nanowires of a nanowire LED are closely spaced and being of high aspect ratio in order to obtain a high luminescence, the p-electrode deposition is a challenging operation. Typically line-of-sight processes, such as sputtering or evaporation are used for electrode deposition. Due to the line-of-side deposition, a preferential growth on the tips of the nanowires and a shadowing effect are observed that result in a tapering of the p-electrode with decreased thickness towards the base of the nanowires 1. Hence, in order to obtain efficient lateral current spreading, the thickness of the p-electrode will become unnecessarily thick on the tips of the nanowires while being insufficiently thick in between the nanowires. The shadowing effect may also be so severe that there are discontinuities in the p-electrode.

Figure 3A:
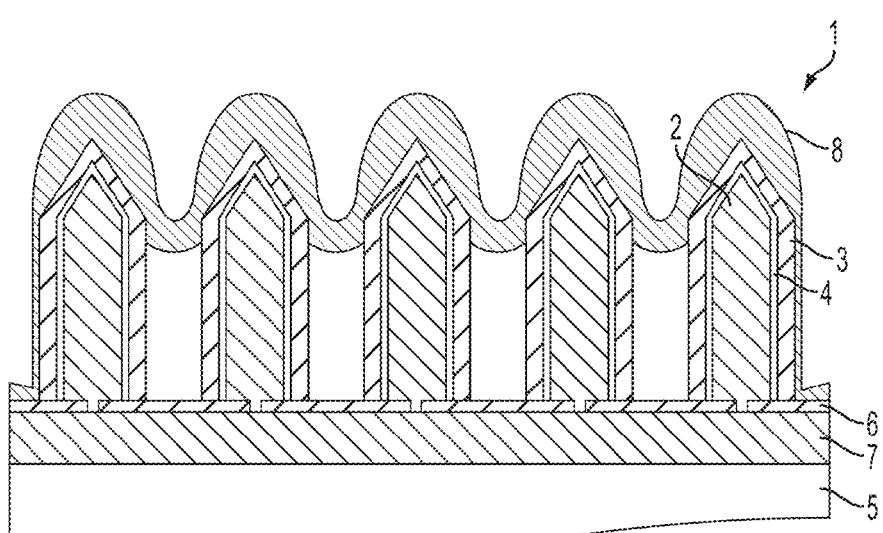

A p-electrode 8 in accordance with embodiments of the invention is at least partly air-bridged between adjacent nanowires 1. FIG. 3a schematically illustrates a p-electrode 8 covering a group of nanowires 1. As noted above, if the shell 3 of the nanowires 1 is n-type, then electrode 8 would be an n-electrode. However, electrode 8 is referred to herein as p-electrode for ease of description. The p-electrode 8 is free-hanging between adjacent nanowires 1 and is only supported by the nanowires 1. The p-electrode 8 encloses a top portion of each nanowire 1 and thereby contacts the p-side of the nanowire LED structure. The p-electrode may extend down along the sides of peripheral nanowires, e.g., in order to provide a connection to a pad arranged on the substrate 5 (as will be described in more detail below and as shown on the right and left edges of FIG. 3a).

Different additional layers may be deposited on the p-electrode. For example layers that improve electrical conductivity or coupling of light out from/into the nanowire may be deposited on the nanowire.

The nanowire LED structure of the embodiments of the present invention is either adapted for top emitting, i.e., light emission through the p-electrode, or bottom emitting, i.e., light emission through the support layer (i.e., through the conductive layer and/or buffer layer and/or substrate). The requirements on the p-electrode are different for these two cases. As used herein, the term light emission includes both visible light (e.g., blue or violet light) as well as UV or IR radiation.

For a top emitting device, the p-electrode needs to be transparent (i.e., it should transmit the majority of light emitted by the LED). Indium Tin Oxide (ITO) is a suitable material for the p-electrode, in particular for the top emitting nanowire LED. The ITO preferably has a thickness of 150-900 nm, more preferably 250-650 nm, most preferably about 500 nm. ITO has been extensively used also for planar components where LED devices are formed by layer-by-layer techniques. In such components the thickness of the ITO layer is preferably about 150 nm since this is enough to obtain an acceptable current spreading. One drawback with increased thickness is that the ITO has comparatively high absorption of light. Therefore the ITO thickness is kept as low as possible. Another reason for keeping the ITO thickness low is that the ITO cannot readily be wet etched if too thick, i.e. more than 150 nm. Surprisingly the optimal ITO thickness for the p-electrode in accordance with the embodiments of then present invention is high. This can be explained by the fact that the efficiency of the nanowire LED is determined by a trade-off between good light coupling, i.e. comparatively thick ITO, and low absorption, i.e. comparatively thin ITO. The ITO can also be combined with layers of other materials to obtain specific properties. For example, similar properties as when having a 500 nm ITO can be obtained by having a 150 nm ITO covered with a silicon oxide layer. A thick p-electrode, preferably uniformly thick, will also contribute to efficient heat dissipation.

Other suitable materials for a p-electrode on a top emitting device are ZnO, doped ZnO and other transparent conducting oxides (TCOs). Important parameters for this material are good transparency, electrical conductivity and the ability to make low resistive contact to the shell. High thermal conductivity is also desirable, together with a matching refractive index (depending on configuration).

In one embodiment of a top emitting nanostructured LED the substrate is provided with a reflecting means (e.g., mirror) that preferably extends in a plane under the nanowire LEDs.

For a bottom emitting LED, the p-electrode is preferably reflective. As shown in the following examples, the p-electrode may comprise one or more additional layers deposited on the p-electrode for improving the reflective and/or conductive properties.

Figure 3B:
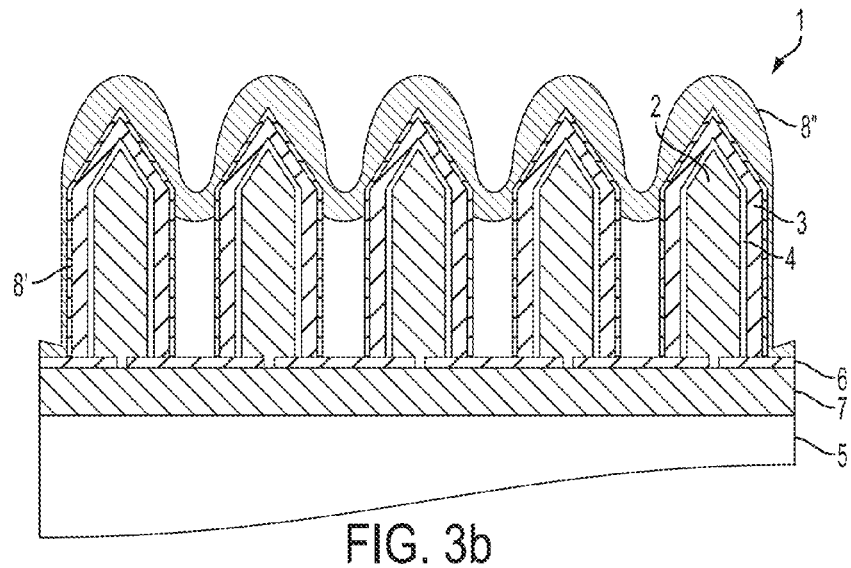

FIG. 3b schematically illustrates one embodiment of a nanowire LED structure in accordance with embodiments of the invention. In principle it is the same structure as shown in FIG. 3a, but the p-electrode comprises a comparatively thin conductive layer 8' enclosing the p-type shell 3 and a comparatively thick air-bridged conductive layer 8'' arranged on the thin conductive layer 8'. The thin conductive layer 8' extends down towards the base of the nanowire 1, longer than the thick conductive layer 8''. The thin conductive layer 8' can for example be deposited using atomic layer deposition or grown as an epitaxial layer on the p-type shell. Layer 8' may be discontinuous between adjacent nanowires and may cover only the nanowires but not the masking layer 6 or buffer layer 7 between the nanowires. With this arrangement the thin conductive layer 8' can be used to obtain an optimal interface to the p-type shell 3 and the thick conductive layer 8'' can be optimised for current spreading and/or light coupling and/or reflection. Thus, only layer 8'' may be used to form the air-bridge.

In an alternative embodiment, in addition to the mask layer 6, the space between the nanowires can also be filled fully or partially with a dielectric (i.e., insulating) material, such as silicon oxide. For partially filled space, the air gap size below the air-bridge is reduced. For fully filled space, there is no longer an air-bridge. Thus, for the embodiments described below with regard to the contact schemes for the nanowires, it should be understood than the nanowires may be contacted either in an air-bridged or non-air-bridged configurations.

In the following first implementation of a method for forming a top emitting nanowire LED structure is described with reference to FIGS. 4a-h. In this embodiment, the same conductive layer is patterned to form both the p and n electrode layers. In this implementation, pads for connecting to the n-side and p-side of the device are formed in pad areas adjacent to the nanowires forming the nanowire LED. However, the invention is not limited to this configuration.

Figure 4A:
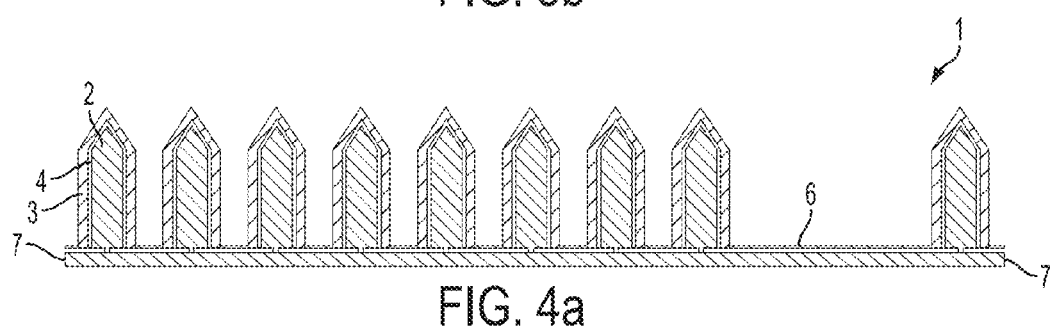

FIG. 4a shows an array of nanowires 1 grown from a buffer layer 7 through a growth masking layer 6. The nanowires preferably comprise an n-type nanowire core 2 enclosed in a p-type shell layer 3 with an intermediate active layer 4 for light generation, as shown in FIG. 1. The growth mask 6 may be patterned by photolithography to define openings for the nanowire growth, as described for example in U.S. Pat. No. 7,829,443. In this implementation, the nanowires are grouped in an n-pad area, a non-active area, a LED area (i.e., the area which emits light) and a p-pad area. However, embodiments of the invention are not limited to this. For example the p-pad area may be arranged on top of the nanowires forming the light emitting part of the nanowire LED structure, whereby the p-pad area and the LED area coincide, as described in PCT International Application Publication Number WO 2010/014032 A1 to Konsek, et al., published Feb. 4, 2010 and incorporated herein by reference in its entirety.

Figure 4B:
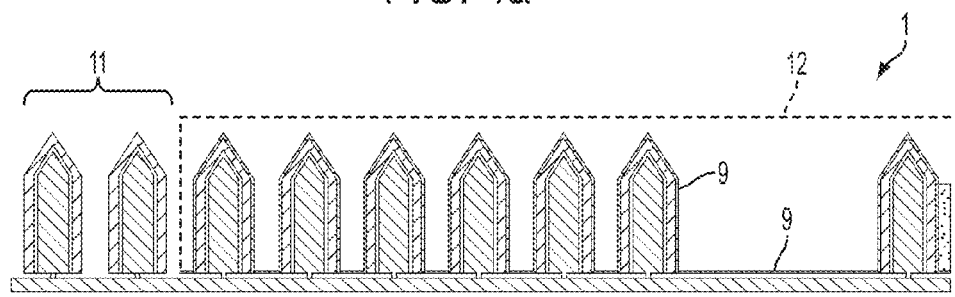

Referring to FIG. 4b, in the next step a protection layer 9 is deposited, at least in the LED-area where the nanowires will form LEDs, to protect nanowires from the subsequent processing. Otherwise residuals from photoresist and reactive ions from sputtering and reactive ion etching (RIE) may cause defects and/or contamination. ZnO deposited with atomic layer deposition (ALD) can be used as a protection layer. One advantage with ALD as a deposition technique is its perfect step coverage. Other materials such as other metal or silicon oxides, e.g., $Al_2O_3$ or $SiO_2$, deposited with ALD or other deposition techniques can also be used. This layer may fill an additional role as insulator on areas where it will be left.

Protection layer 9 deposition is followed by opening up, through lithography and etching, to the buffer layer 7 through the protection layer and the growth mask in the n-pad area 11. In other words, as shown in FIG. 4b, a photoresist or another masking layer (shown as dashed lines 12) is formed over the entire device and then removed in the n-pad area 11 by photolithography. The exposed protection layer 9 and the exposed masking layer 6 between the nanowires 1 are etched by any suitable etching method which can stop on the buffer layer (e.g., any wet or dry etching method which can etch a metal oxide or silicon oxide selectively with respect to a III-nitride semiconductor buffer layer). The purpose is to access the buffer layer 7 for arranging an electrode thereon, in order to provide an electrical connection through the buffer layer 7 to the n-side of the nanowires 1 (i.e., an electrical connection through n-type layer 7 to n-type nanowire cores 2).

Figure 4C:
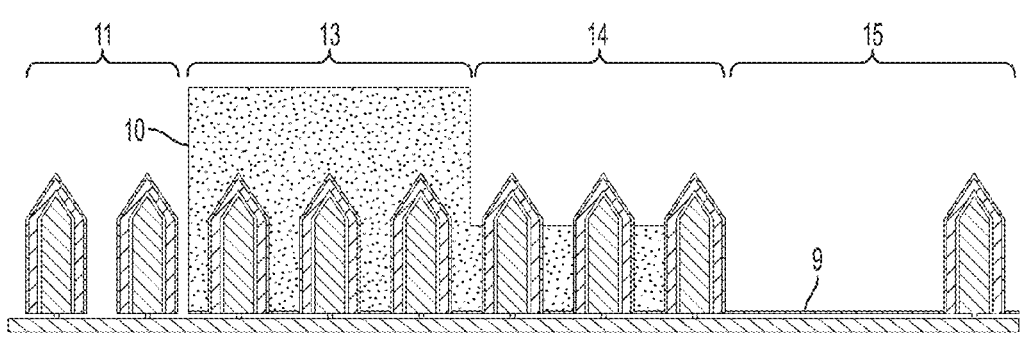

Referring to FIG. 4c, the next step is to form a sacrificial layer 10, such as a photoresist or another suitable sacrificial material layer, with two different thicknesses extending over the non-active area and the p-pad area. The photoresist layer should completely cover the nanowires in the non-active area 13, whereas it should partly cover the nanowires 1 in the LED area 14, leaving a top portion of each nanowire 1 in the LED area 14 exposed. If the same contact materials are to be used in the n- and p-electrodes, areas which should be accessed as contact pads, i.e., the n-pad area 11 and the p-pad area 15, the n-pad area is 11 preferably not covered by photoresist. This is clearly seen in the left part of FIG. 4c. As appreciated by one skilled in the art, this photoresist layer can be formed e.g. by depositing photoresist, and using two masks and two exposures and then development, or larger amplitude exposure in area 14 than in area 13 for a positive photoresist (or vice versa for negative photoresist). Also, the photoresist can comprise multiple layers (e.g., forming, exposing and developing a first resist in areas 13 and 14 and then forming, exposing and developing a second resist only in area 13 over the first resist). If desired, the photoresist 10 may comprise a portion of the photoresist layer 12 used in FIG. 4b to pattern layers 9 and 6. In this case, photoresist layer 12 is exposed a second time using the methods described above in areas 14 and 15 but not in area 13 (or vice versa for a negative photoresist), and then developed (i.e., removed) fully in area 15 and partially in area 14.

Figure 4D:
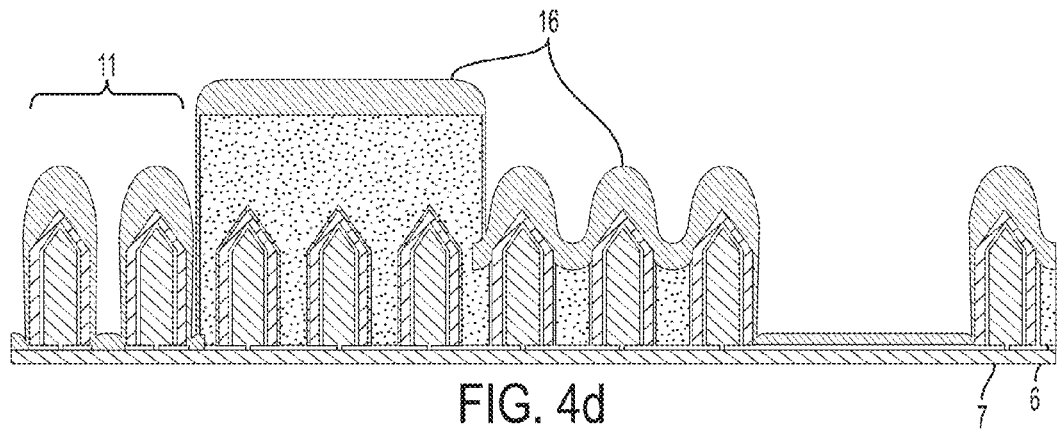

Referring to FIG. 4d, the next step is to remove the protection layer 9 on at least the exposed top portions of the nanowires in the LED area 14 that are exposed outside of photoresist pattern 10. This may be done by selective etching which selectively etches the oxide protective layer 9 but not the masking layer 6 (e.g., silicon nitride) or the semiconductor buffer layer 7 or semiconductor nanowires 1. If desired, layer 9 may be left in areas where it does not interfere in a contact between the semiconductor material and a respective electrode to provide additional electrical insulation on top of the masking layer 6. For example, an aluminium oxide layer may be used as such a permanent protective layer 9 in combination with silicon nitride masking layer 6.

Thereafter the p-electrode layer 16 is deposited. Since the p-electrode becomes elevated and does not have to extend down deeply into the narrow space between the nanowires 1, line-of-sight processes such as sputtering or evaporation can be used. Of course the n-electrode layer is formed at the same time since the n-pad area 11 is exposed. It should be noted that p-electrode 16 does not contact the n-type buffer layer 7 in the p-pad area 15 because the buffer layer 7 is covered by the masking layer 6 in the p-pad area. Thus, a short circuit between the p-electrode and the n-buffer layer/n-nanowire cores is avoided. However, if the left side portion of layer 16 is used to form the n-electrode, then it this portion of layer 16 contacts the exposed buffer layer 7 between the nanowires in the n-pad area 11. It should be noted that layer 16 does not contact the nanowires 1 in the non-active area 13 which is covered by the photoresist 13.

Figure 4E:
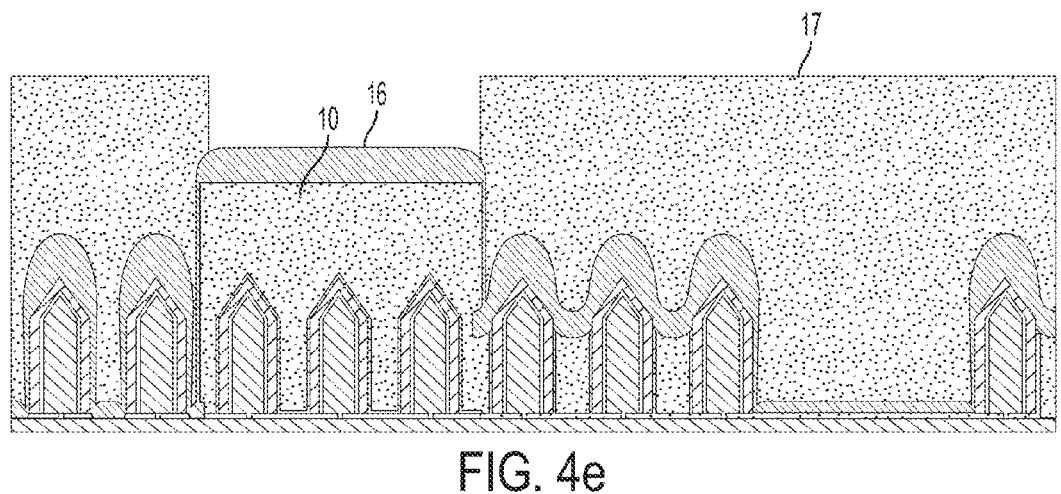

Referring to FIG. 4e, next step is to do another lithography step leaving another photoresist pattern 17 in the p-pad area 15, the LED area 14 and the n-pad area 11. This may be done by forming another photoresist layer over the device shown in FIG. 4d (including over the metal electrode 16 covered resist pattern 10 in non-active area 13) and then exposing and developing the photoresist to leave the photoresist pattern 17 on both sides of the metal electrode 16 covered resist pattern 10.

Figure 4F:
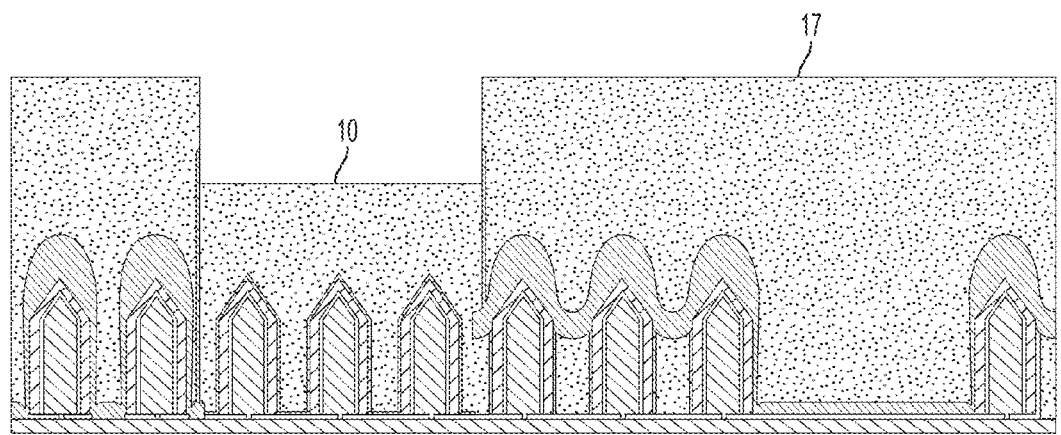

Referring to FIG. 4f, the next step is to remove the electrode material 16 on the areas where electrode material is not covered by resist pattern 17 from the previous step, i.e., in the non-active area 13, which can be done by selective dry or wet etching which does not remove the photoresist patterns 10 and 17. This causes the electrode layer 16 to become discontinuous such that it is removed in the non-active area 13 between the n-pad area 11 and the active and p-pad areas 14, 15.

Figure 4G:
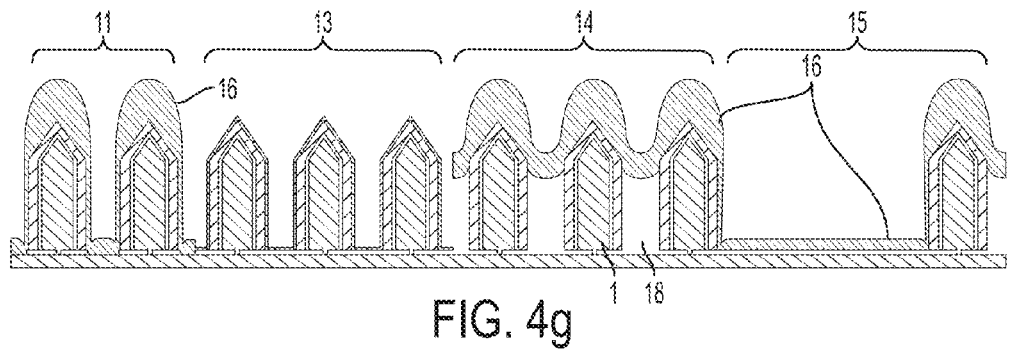

Referring to FIG. 4g, next step is removal of all remaining photoresist 10, 17, which can be done by dissolving and/or plasma etching. This leaves the p-electrode layer 16 free-hanging between the nanowires 1 in the LED area 14. This forms the air-bridge with empty space 18 between the electrode 16, nanowires 1 and the masking layer 6.

Figure 4H:
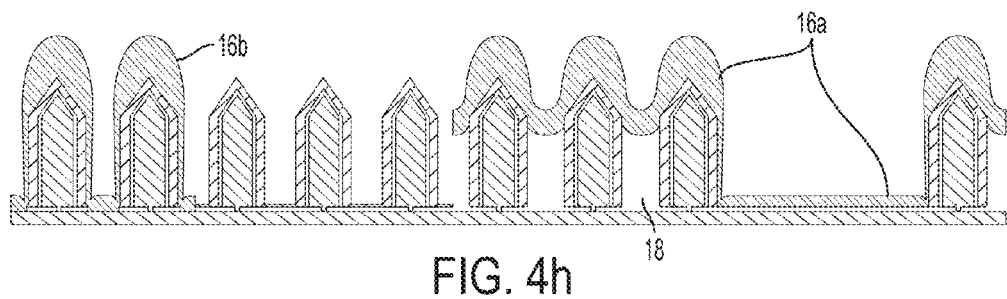
Figure 5:
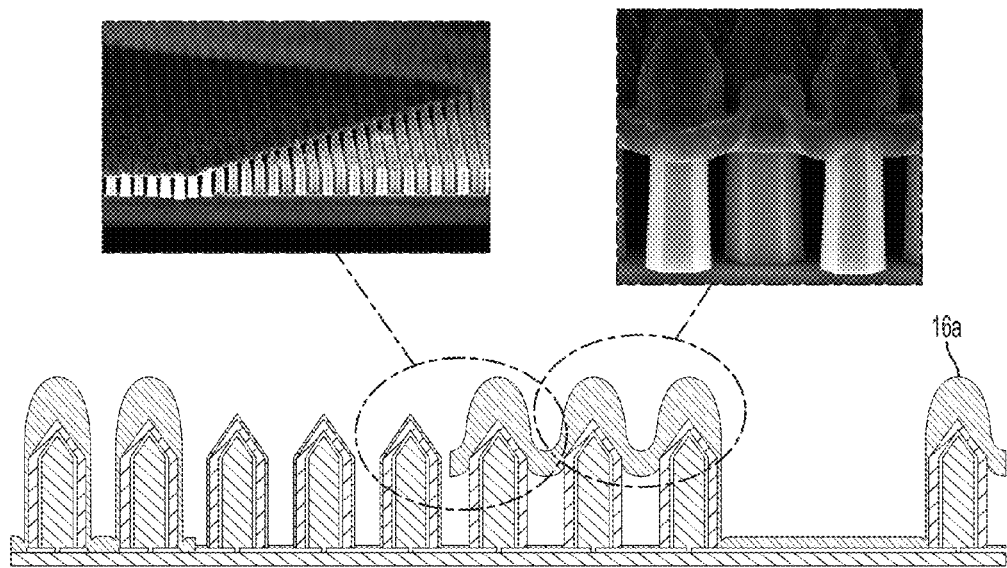
FIG. 5 shows two scanning electron microscope images of an air-bridged p-electrode in accordance with embodiments of the invention, FIGS. 6a-i schematically illustrate side cross sectional views of a third implementation of a method in accordance with another embodiment of the invention.

Referring to FIG. 4h, finally residues of the protective layer 9 on the non-active area 13 that still may be present is removed. Thus, layer 16 forms the p-electrode 16a which contacts the tips of the nanowire 1 p-shells 3 and contacts the masking layer 6 in the p-pad area, as well as the n-electrode 16b which contacts the n-buffer layer 7 in the n-pad area 11. FIG. 5 shows two scanning electron microscope images of an air-bridged p-electrode in accordance with this embodiment of the invention. The intersection between the non-active area and LED area with the air-bridged p-electrode is visible on the left.

Since layer 16 was removed in non-active area 13, the same layer 16 may be used to form both p- and n-electrodes. Thus, in the above process sequence illustrated by FIGS. 4a to 4h, the p-electrode and n-electrode are deposited in the same step. The n-electrode layer 16b comprises an n-pad area 11 on a first part of the buffer layer 7. The p-electrode layer 16a comprises a p-pad area 15 on the nanowires in a LED active area 14 or on a dielectric masking layer 6 on the buffer layer 7 adjacent to the nanowires in the LED active area. The n-pad area and the p-pad area are separated by a non active area 13 comprising dummy nanowires 1 which do not contact the p-electrode (i.e., these nanowires do not emit light).

However, in an alternative second embodiment, the p-electrode is provided in a first step and the n-electrode is formed from a different material at a later stage. Such a process is discloses in FIGS. 4i to 4s and will be briefly described below. The description of the same elements and steps from FIGS. 4a-4h will not be repeated below for brevity.

Figure 4I:
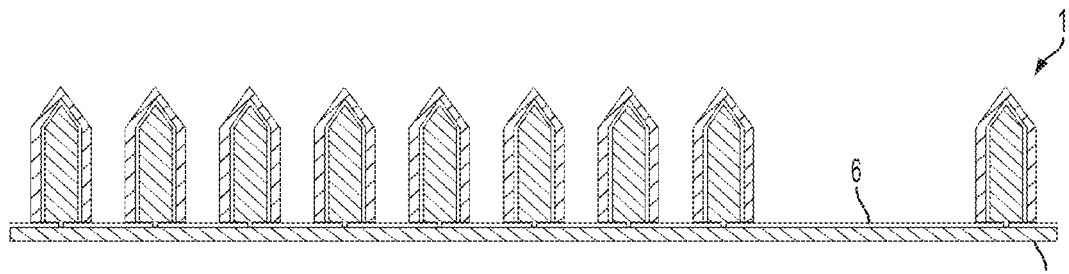
Figure 4J:
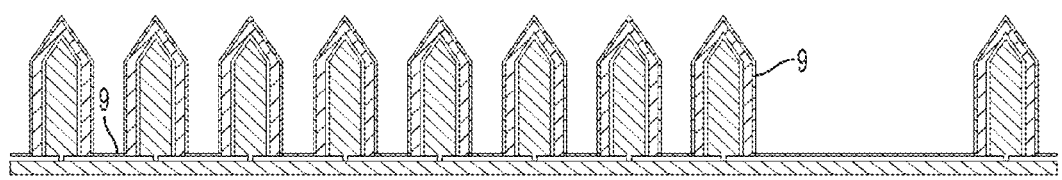
Figure 4K:
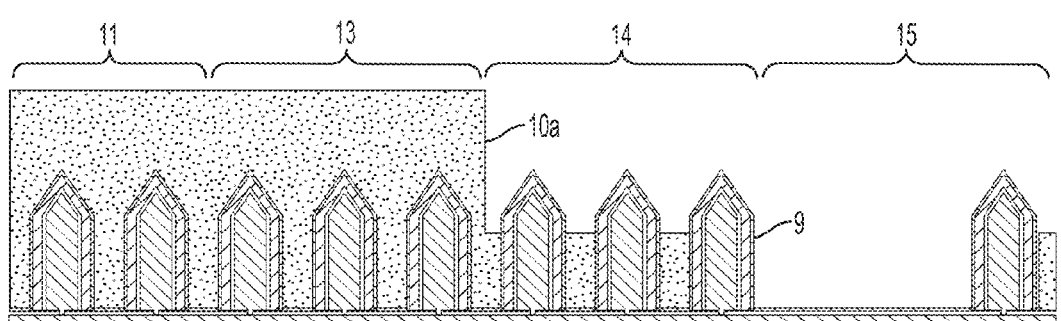

The first two steps in the second embodiment method are identical to the first embodiment method, i.e. FIGS. 4a and b represent the same steps as FIGS. 4i and j. However, the protective layer 9 and masking layer 6 are not removed in the n-pad area 11 FIG. 4j as in FIG. 4b.

In the next step, a sacrificial (e.g., resist) layer 10a is deposited in two different thicknesses such that no nanowires are left uncovered in the n-pad area 11 as in the first embodiment. Thus, in the left hand side of FIG. 4k it can be seen that the nanowires in area 11 are entirely covered just as the central nanowires in the non-active region 13, as opposed to in FIG. 4c where the leftmost nanowires in n-pad area 11 are completely uncovered. The nanowires in the LED area 14 are partially exposed on the top in the photoresist 10a. The p-pad area 15 is completely exposed in photoresist pattern 10a.

Figure 4L:
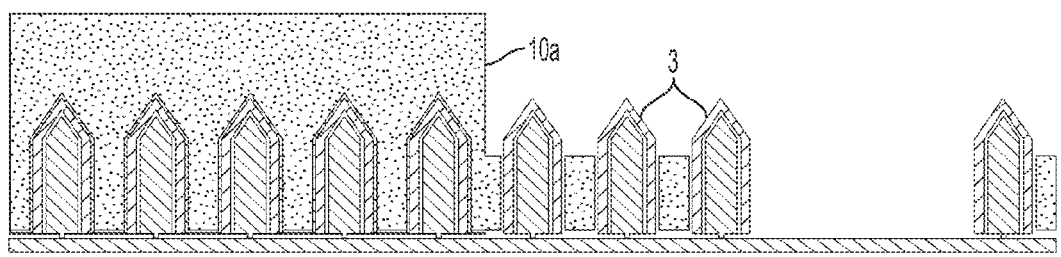

FIG. 4l shows that the protective layer 9 is at least partially removed from the exposed nanowire tips in LED area 13 in order to provide for contact between the p-shell 3 of the nanowires in area 13 and the p-electrode.

Figure 4M:
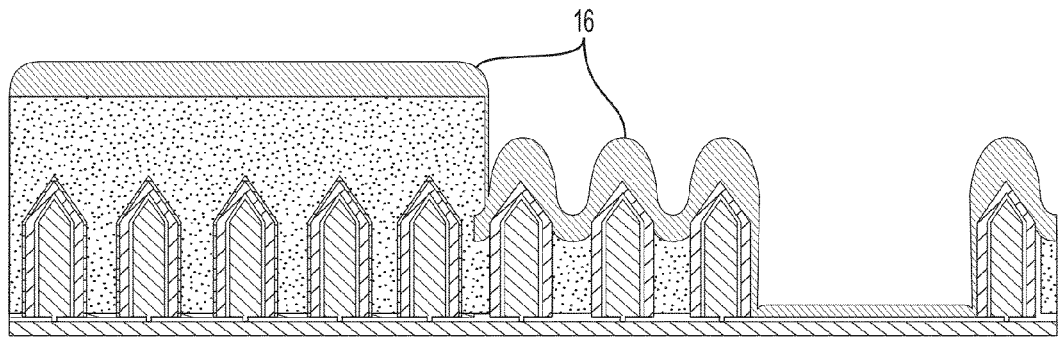

The p-electrode layer 16 is then deposited as shown in FIG. 4m. Layer 16 covers the entire structure. The inactive 13 and n-contact 11 areas are now covered by the photoresist 10a and layer 16 is formed on top of the photoresist 10a. Layer 16 contacts the exposed p-shells 3 of the nanowires in LED area 14 and the masking layer 6 in the p-pad area 15.

Figure 4N:
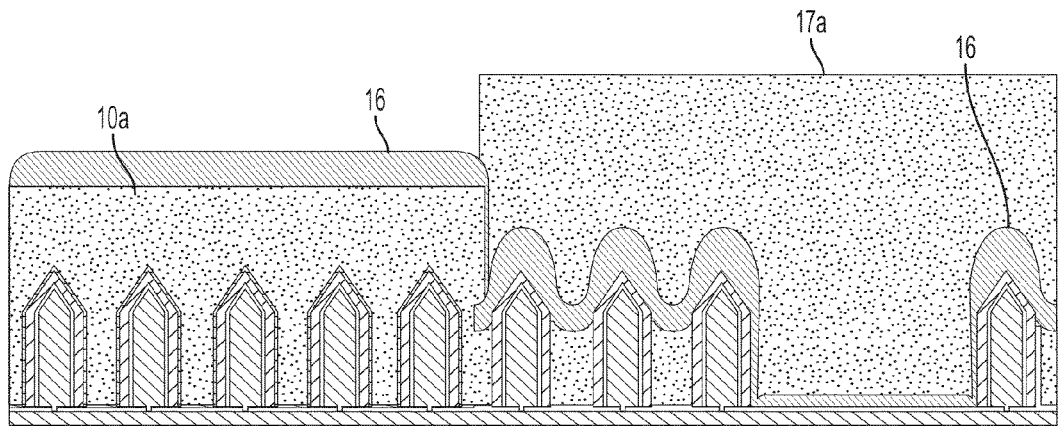

As shown in FIG. 4n, a second photoresist pattern 17a is now provided over the p-electrode layer 16 in the LED area 14 and the p-pad area 15. Photoresist pattern 17a is removed in areas 13 and 11. Thus, layer 16 is exposed in areas 11 and 13.

Figure 4O:
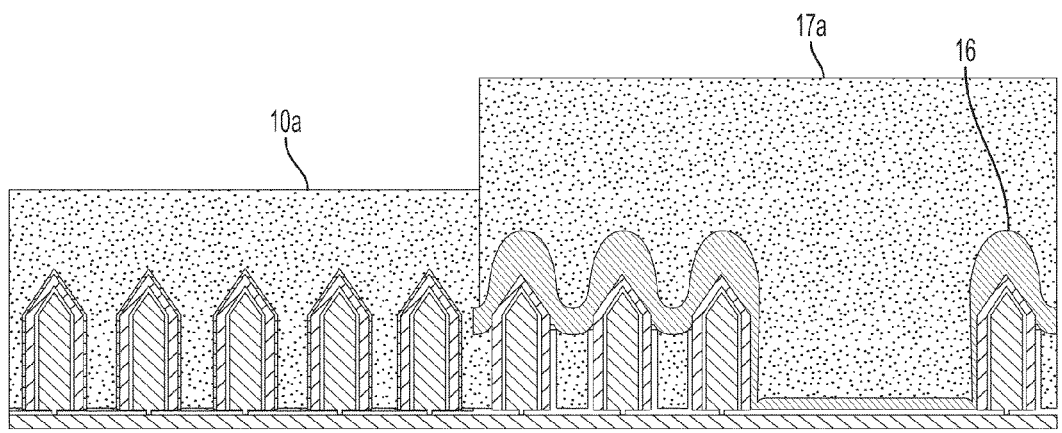

The exposed p-electrode layer 16 is then removed from areas 11 and 13 by selective etching, as shown in FIG. 4o.

Figure 4P:
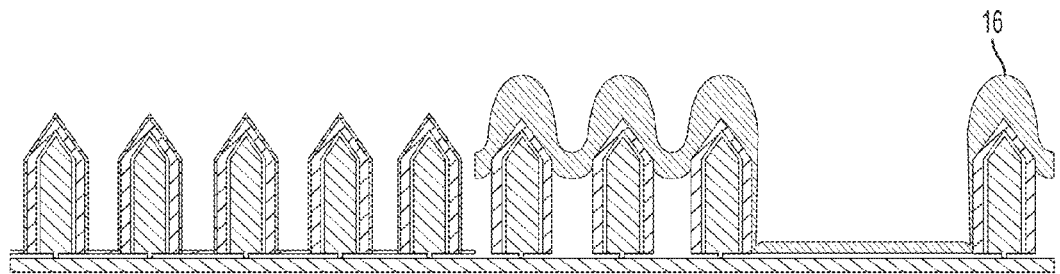

As shown in FIG. 4p, all photoresist 10a, 17a is removed such that the p-electrode layer 16 forms an air-bridge with underlying empty spaces 18 between the nanowires in LED area 14, and forms a p-contact pad in area 15.

Figure 4Q:
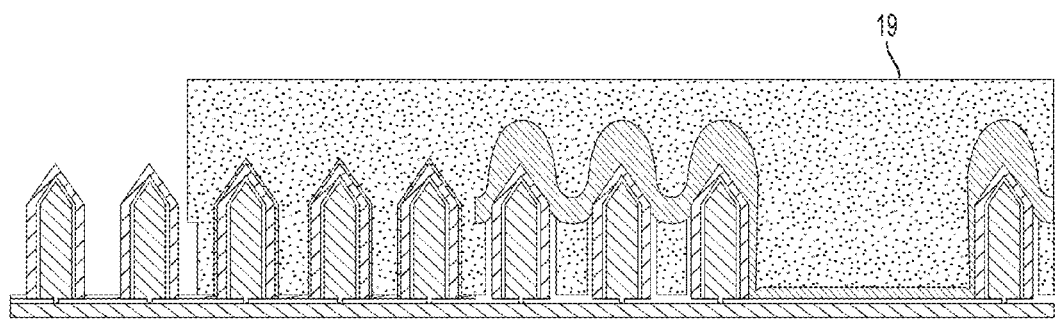

Next, a new photoresist pattern 19 is applied to cover areas 13, 14 and 15 but not the n-pad area 11, as can be seen in FIG. 4q. The protective layer 9 and masking layer 6 are removed from exposed area 11.

Figure 4R:
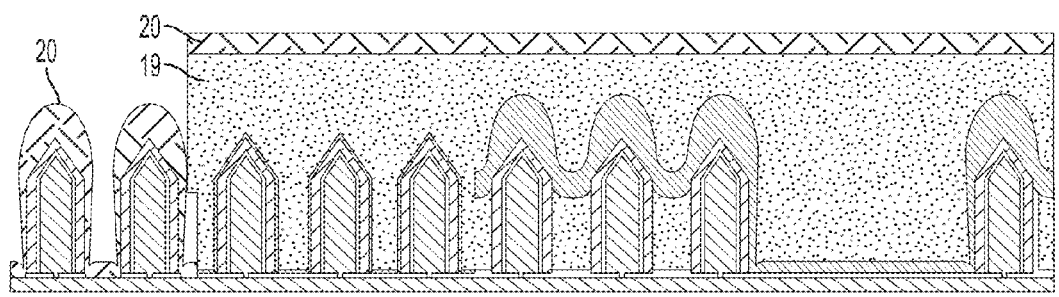

N-electrode layer 20 is then deposited over the entire structure, as shown in FIG. 4r. Layer 20 may comprise Ti and Al sublayers or any other suitable metal. Layer 20 contacts the exposed buffer layer 7 and "dummy" shorted nanowires in area 11. Layer 20 rests on photoresist 19 in areas 13, 14 and 15.

Figure 4S:
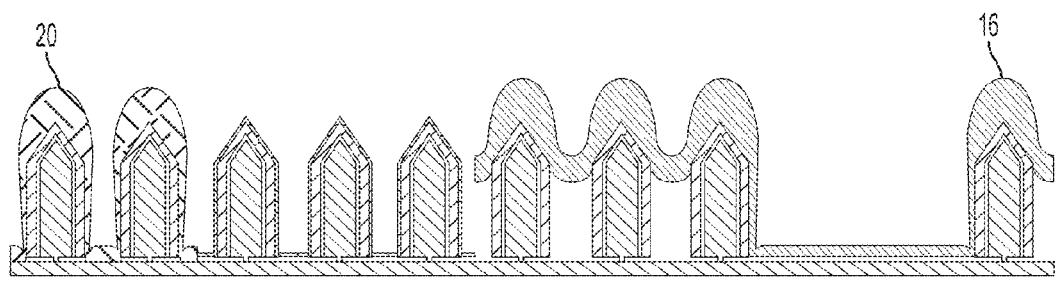

FIG. 4s shows a lift-off step in which the photoresist pattern 19 is removed to lift off layer 20 in areas 13, 14 and 15, such that the remaining layer 20 in area 11 forms the n-electrode. There is no electrode layers 16, 20 in the non-active area 13. This prevents shorting of layer 16 and 20. Dummy nanowires are located in the non-active area 13.

Figure 10:
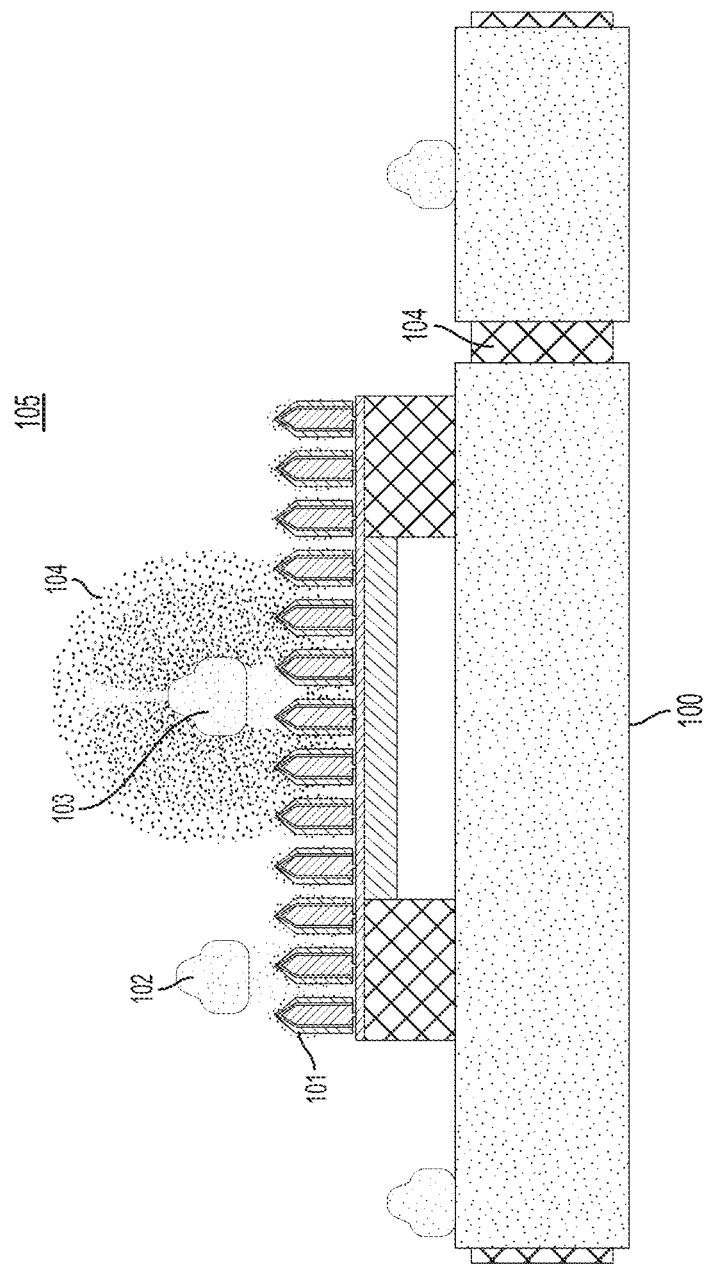
FIG. 10 shows the side view of the device of the embodiment of FIG. 9 mounted on a submount with appropriate contacts.
Figure 12:
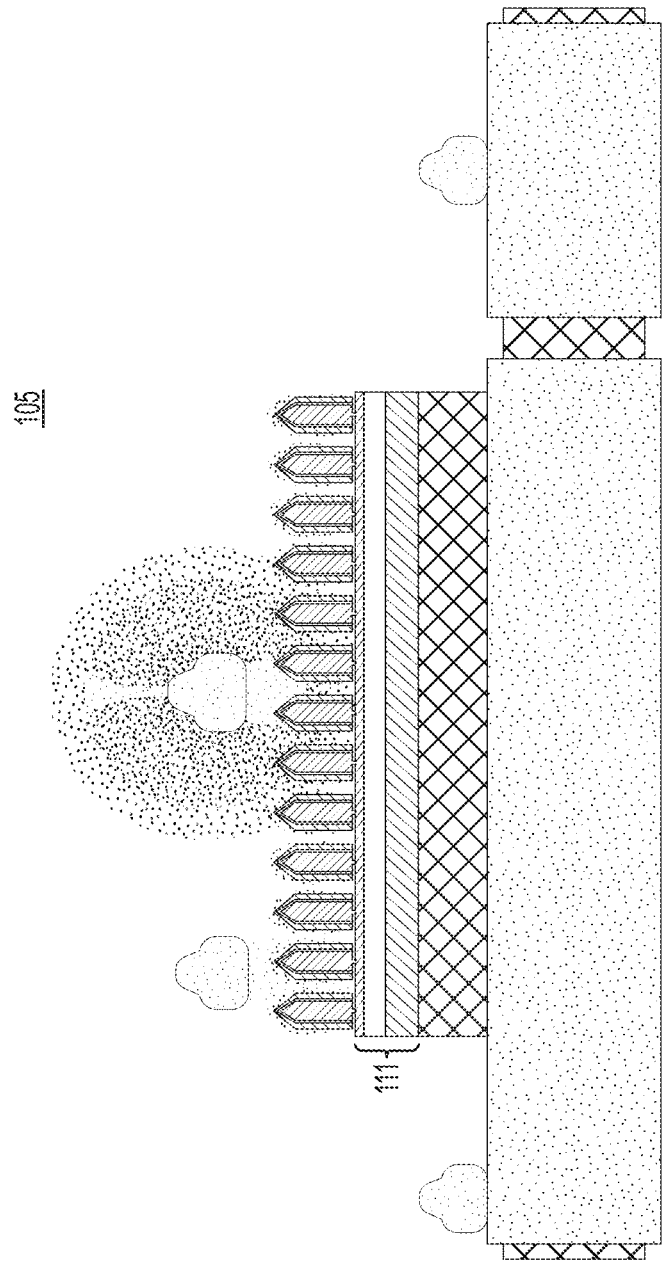
FIG. 12 shows the side view of the device of the embodiment of FIG. 11 mounted on a submount with appropriate contacts.

FIGS. 4h and 4s show in process devices prior to formation of contacts (e.g., lead wires or bump electrodes) to the p-electrode 16a, 16 and n-electrode 16b, 20, respectively. However, it should be understood that the contacts described with respect to FIG. 6, 10 or 12 are made to the p-electrode in p-pad area 15 and the n-pad area 11, respectively. Furthermore, as noted above, the p-pad area 15 may be on top of nanowires (e.g., areas 14 and 15 are combined) rather than between nanowires as shown in FIGS. 4h and 4s.

The following third implementation of a method for forming a bottom emitting nanowire LED structure is described with reference to FIGS. 6a-h. In this implementation pads for connecting to the n-side and p-side are again formed in n-pad areas and p-pad areas, respectively, adjacent to the nanowires forming the nanowire LED. However, the invention is not limited to this. The same elements that were described above will not be described again below for brevity.

Figure 6A:
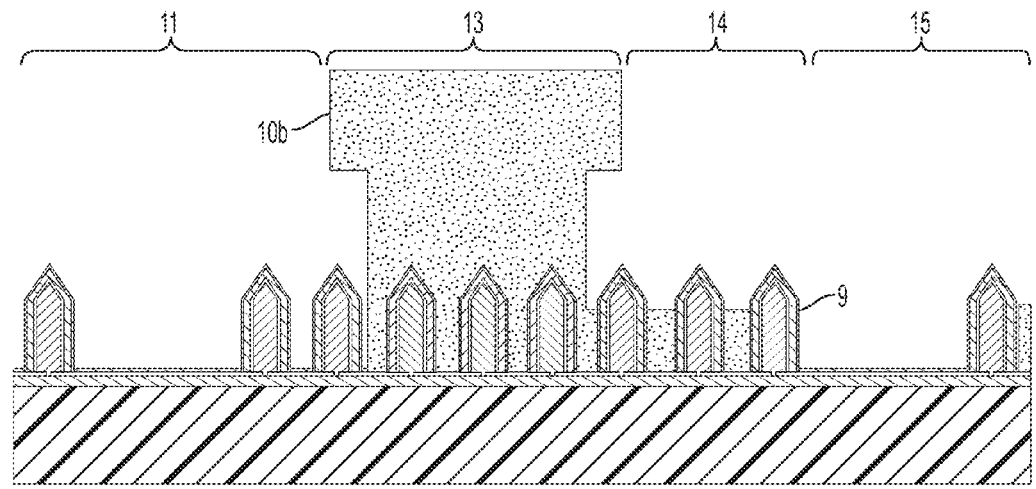

FIG. 6a shows the structure which is similar to FIG. 4a. As in the previously described with respect to FIG. 4a, a photoresist layer or pattern 10b with two thicknesses completely covers nanowires in the non-active area 13 and partially encloses the nanowires in the LED area 14, leaving the top nanowire portions exposed. The n-pad area 11 and the p-pad area 15 are open and not covered by the photoresist pattern 10b.

Figure 6B:
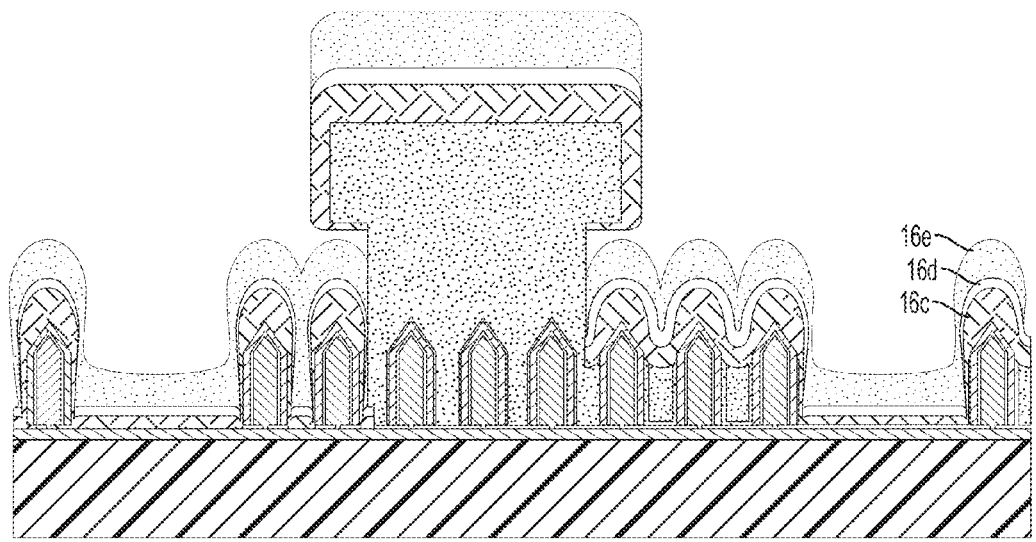

Referring to FIG. 6b, in a next step, the protective layer 9 on the exposed top portion of the nanowires in the LED area 14 is selectively removed. Then, a p-electrode layer 16c, a current spreading layer 16d and one or more reflector layers 16e are deposited over the entire device by for instance sputtering or evaporation. One or more of these layers may be omitted (e.g., the reflector layer 16d may be omitted if a separate mirror will be used), as long as at least one conductive layer is formed.

Figure 6C:
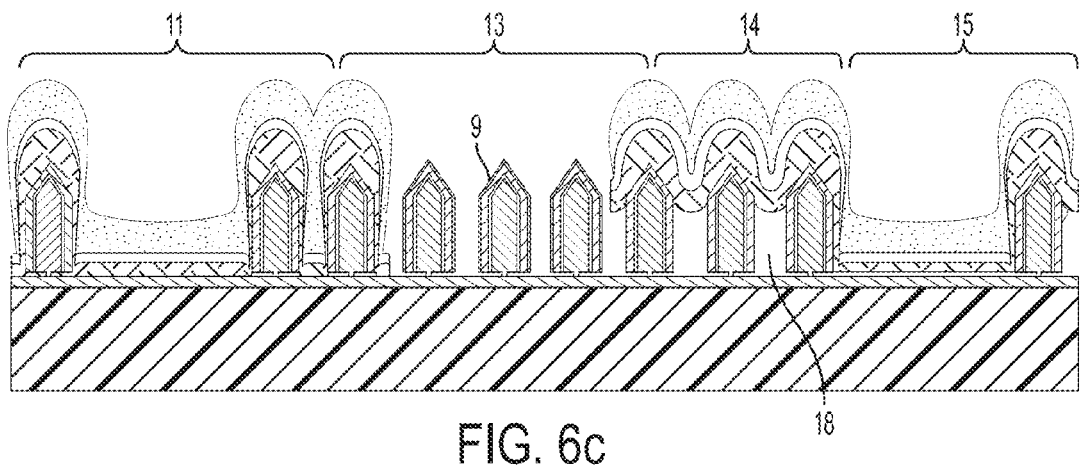

Referring to FIG. 6c, in a next step the photoresist 10b is removed to lift off layers 16c, 16d and 16e, and is optionally followed by a heat treatment to tune the properties of the layers. This leaves layers 16c-16e in areas 11, 14 and 15. An air bridge is formed in area 14 with empty spaces 18 described above. This separates layer 16c-e into p-electrode 22 and n-electrodes 23, as shown in FIG. 6d.

Figure 6D:
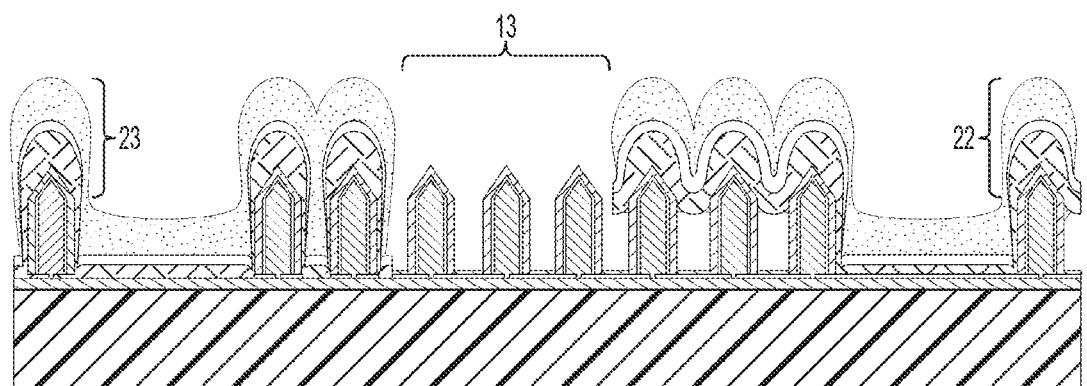

Referring to FIG. 6d, in next step, the residues of the protective layer 9, on the non-active area 13 is removed if desired.

Figure 6E:
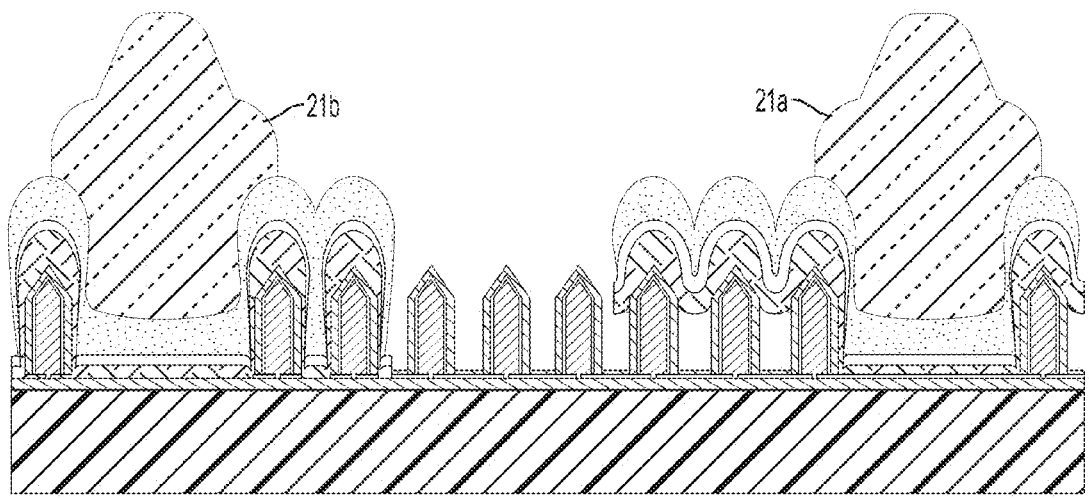

Referring to FIG. 6e, in a next step solder ball bumps (SBB) (e.g., p-bump 21a and n-bump 21b) are attached to the p-pad 15 and n-pad 11 areas, respectively. In the p-pad area 15, the p-electrode 22 is isolated from the n-buffer layer 7 by the masking layer 6. The p-electrode 22 provides electrical contact between the p-bump 21a and the p-shells 3 in area 14. The n-electrode 23 provides contact between n-bump 21b and the n-buffer layer 7 and n-cores 2. Thus, the buffer layer is accessed by the n-electrode/n-bump and the shells are accessed by the p-electrode/p-bump to provide an external electrical connection to the LEDs.

Figure 6F:
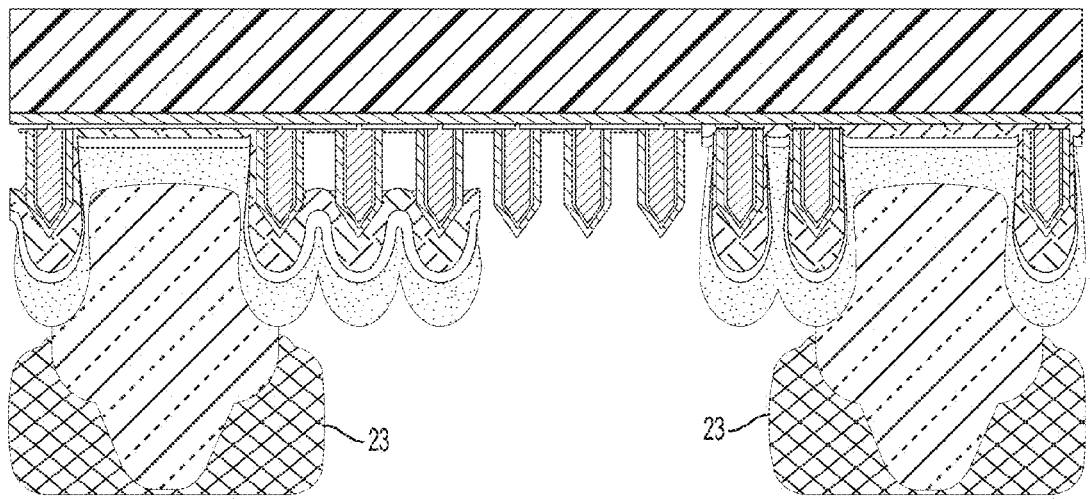

Referring to FIG. 6f, in a next step the chip, i.e., the LED structure, is flipped over and dipped in a conductive adhesive 23 which remains on the bumps 21a, 21b. In addition to providing electrical conductivity, the conductive adhesive may improve the heat dissipation properties.

Figure 6G:
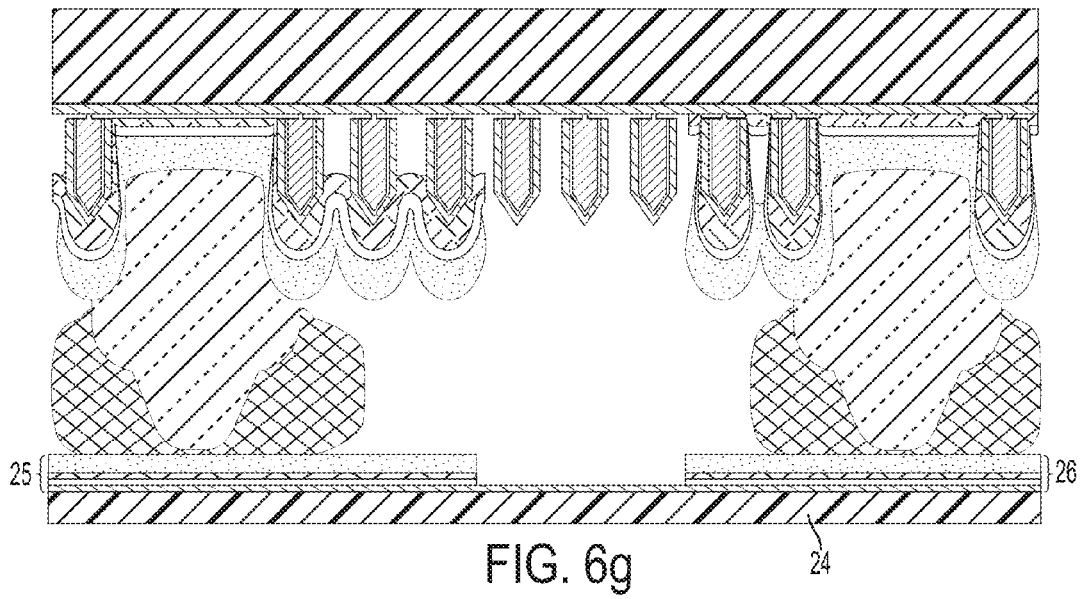

Referring to FIG. 6g, in a next step the chip is mounted on a carrier 24 pre-processed with p- and n-electrodes 25 and 26. Although described in terms of a SBB arrangement it is appreciated by a person skilled in the art that there are other contact alternatives, such as lead wire or lead frame connections.

Figure 6H:
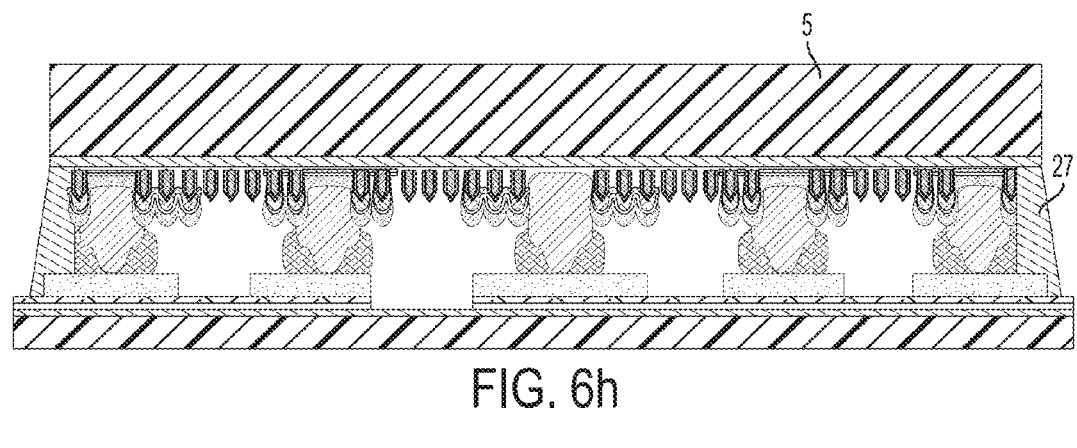

Referring to FIG. 6h, in a next step, the space between the chip and the carrier is underfilled, for example by an epoxy material 27. The underfill provides structural rigidity and may also contribute to improved heat dissipation.

Figure 6I:
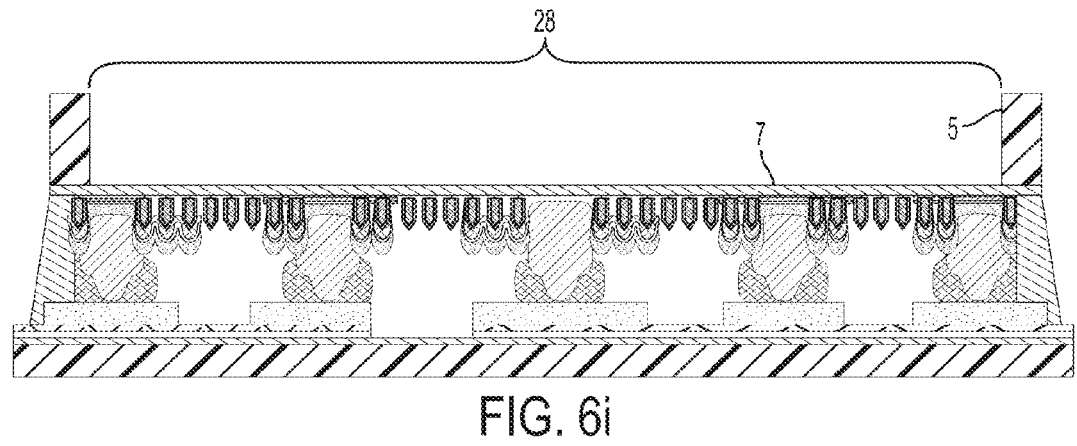

Referring to FIG. 6i, in a next step the Si substrate 5 is removed completely or partially by for example wet or dry etching to form an opening 28 exposing the buffer layer 7. If desired, the buffer layer 7 may also be removed through opening 28 to expose the nanowire 1 bases.

Figure 7:
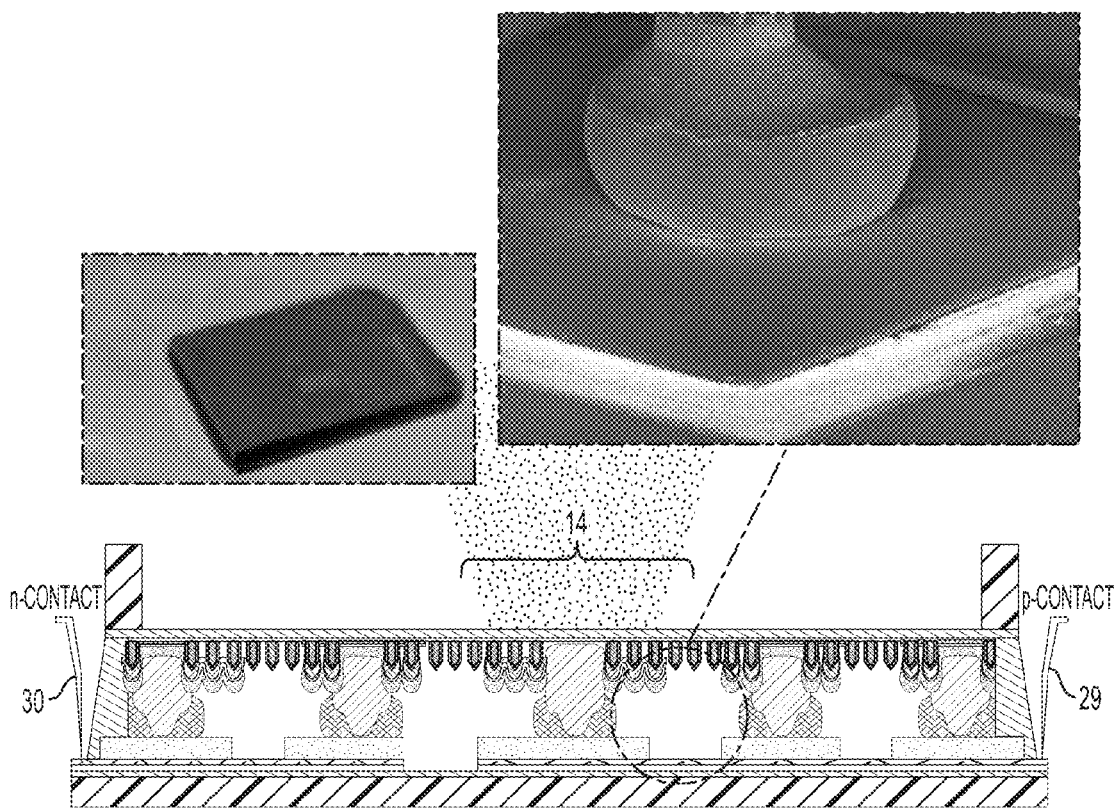
FIG. 7 shows a scanning electron microscope image of a nanowire LED structure manufactured according to the third implementation example, FIG. 8 schematically illustrates a side cross sectional view of an array of nanowire LED structures comprising axial pn junctions and an air-bridged p-electrode in accordance with an alternative embodiment of the invention.

FIG. 7 shows a nanowire structure obtained by this implementation of the method with a solder bump arranged on the nanowires. The p- and n-electrodes are accessed via the carrier wafer using a p-contact 29 and an n-contact 30. This forms a bottom emitting LED device which emits light from LED areas 14 through the buffer layer 7.

Figure 8:
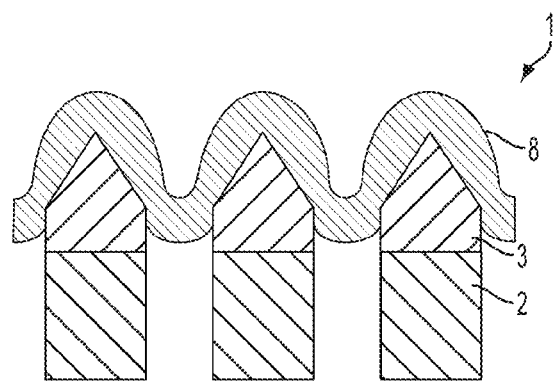

As mentioned above, nanowires may comprise heterostructures of compositionally different materials, conductivity type and/or doping such as the above exemplified radial heterostructures forming the pn or pin junction. In addition, axial heterostructures within the nanowire core may also be formed. These axial heterostructures can form pn- or p-i-n-junctions that can be used for light generation in a nanowire LED. FIG. 8 schematically illustrates a plurality of nanowires with axial pn-junctions (e.g., the p-portion 3 located above the n-portion 2 in the axial direction) contacted on the p-side 3 with an air-bridge electrode 8 arrangement.

Although the present invention is described in terms of contacting of nanowire LEDs, it should be appreciated that other nanowire based semiconductor devices, such as field-effect transistors, diodes and, in particular, devices involving light absorption or light generation, such as, photodetectors, solar cells, lasers, etc., can be contacted in the same way, and in particular the air-bridge arrangement can be implemented on any nanowire structures.

All references to top, bottom, base, lateral, etc are introduced for the easy of understanding only, and should not be considered as limiting to specific orientation. Furthermore, the dimensions of the structures in the drawings are not necessarily to scale.

Further embodiments of the invention provide processes for packaging top emitting LEDs as disclosed above, and such processes will be described below with reference to FIGS. 9-12.

Figure 9:
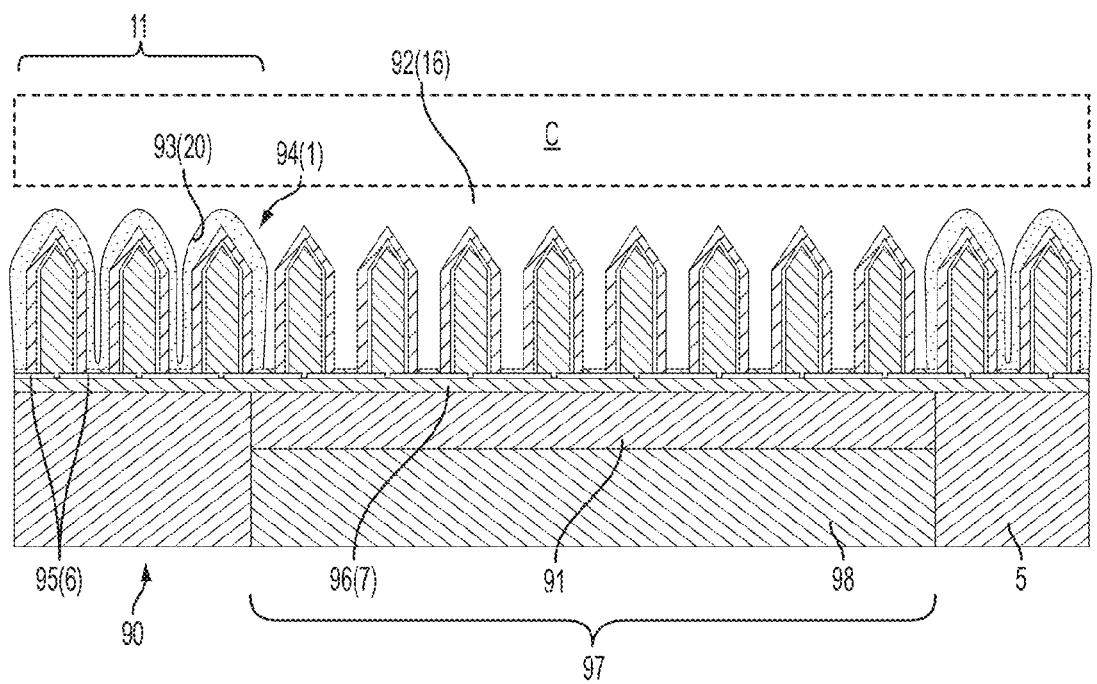
FIG. 9 illustrates a side cross sectional view of a device according to a further embodiment of the invention.

Reference is first made to FIG. 9, showing a top emitting nanowire LED structure 90 having a mirror 91 provided on the backside. Thus, as already mentioned, for top emitting LEDs the p-contact 92(6) is transparent, preferably made of TCO, conductive polymer or thin metal and in order to direct the emitted light through the top, a mirror is preferably provided below.

In order to attach a mirror, different methods can be used. In one embodiment, after the p-contact 92 has been provided, an n-contact 93(20) is provided on selected n-contact areas 11 on the LED array on the tips of the nanowires and between the nanowires in contact with the buffer layer 96 in the selected area 11 to provide a base for later wire bonding. The n-contact, suitably made of Ti/Al or other conductors (e.g., transparent alternatives, such as TCO), is deposited so as to cover the entire nanowire 94(1) and down through the masking layer 95(6) so as to contact the buffer layer 96(7), whereby after suitable wire bonding can be applied to the LED array. The deposition of the n-contact can be performed by any deposition technique, exemplified by sputtering, thermal or e-beam evaporation and plating. In order to make contact for the Ti/Al, openings are made in the masking layer 95 by etching e.g., wet etching or by dry etching (RIE).

In order to enable handling during the further processing of the array, a temporary carrier C is bonded to the p-contact side. The carrier is schematically shown in ghost lines. This carrier is suitably a silicon wafer, a ceramic substrate, or a glass or metal plate. There are several methods for achieving the bonding of the carrier, such as a product obtainable from Brewer Science called "Temporary wafer bonding" or contact bonding. Other alternatives are to use photoresist, BCB or some other polymer temporary adhesive material. The adhesive is coated on the components to be bonded and pressure (and optionally heating) is applied. When the carrier is attached, the original growth substrate 5 on which the nanowires were grown is subjected to an etching procedure to provide a recess 97, such as an opening, depression or full removal of the growth substrate down to the GaN/AlGaN buffer layer, i.e. on the back side of the array. The width of the recess is indicated by the bracket. Etching is suitably by dry etching, e.g., the so called Bosch Process, well known to the skilled artisan. It is also possible to use wet chemical methods or a combination of grinding and etching.

A further step of removing (partly or entirely) the GaN/AlGaN buffer layer and replacing it with a conductive layer (e.g., 91) can optionally be made at this point. In top emitting applications this layer can preferably comprise a mirror, but should be transparent for bottom emitting applications.

If, the growth substrate is only partly removed, in order to protect the areas of the substrate which should not form the depression, suitable masks (e.g., photoresist) are applied, depending on the etch method used.

The mirror 91 is provided in the recess 97 for a top emitting LED. If desired, plural mirrors may be formed in plural recesses in the substrate. The provision of the mirror can be performed in several different ways. A preferred method is by sputtering Ag into the recess 97 to a thickness of about 1 μm. Thicker layers improve thermal conductivity but usually do not improve reflectivity appreciably. Alternatively methods such as thermal or e-beam evaporation or plating can be used. This mirror can be passive in the sense that it is not electrically active in the array. The mirror simply reflects light out from the array to the top of the nanowires. It can also be active, but then additional steps, such as thinning of resistive layers should be made if the buffer ends with a material such as AlGaN.

After the mirror has been provided, the recess 97 is filled up with a filler material 98, e.g. epoxy or other suitable heat conductive material, preferably of high mechanical strength, so as to provide structural rigidity. Other appropriate materials are exemplified by, but not limited to TiN, graphene, and other polycrystalline or amorphous carbon films. Such materials may be most suitable in cases where the growth substrate is fully removed, as deposition times may be a constraint when used in deep recess structures. Then, the entire structure is debonded from the temporary carrier C to arrive at the structure shown in FIG. 9.

The structure thus obtained is mounted to a suitable mount structure or carrier 100, as shown in FIG. 10. The mount structure surface may comprise layers to enhance adhesion or improve thermal properties of the device such as metals, TiN, graphene, and other polycrystalline or amorphous carbon films. Contacts pads, preferably gold or other conductive materials 101 are deposited on the n-contact areas to provide a bond pad for wire bonding. Wires 102, such as gold or other wires are then attached between the mount 100 and pad 101. Solder bumps or bonds may be used to secure the wire 102 in place. At least one p-contact pad 103 is also provided on the p-electrode and wire 104 bonding is also made to this contact from the mount 100. Finally, there is provided a protective "bulb" or package 105 over the exposed LEDs, suitably of a silicone material.

Figure 11:
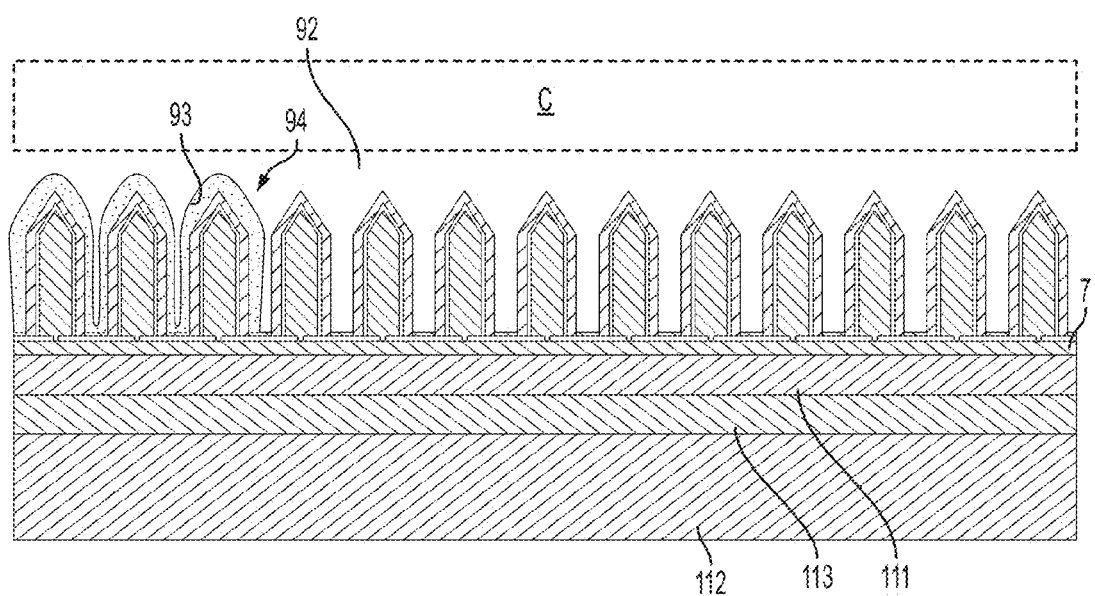
FIG. 11 illustrates a side cross sectional view of a device according to a still further embodiment of the invention.

Now, with reference to FIG. 11, a variant for the provision of a passive mirror is shown. P- and n-contacts 92, 93, respectively, are provided as described above with respect to FIG. 9, and a temporary carrier C is also attached in the same manner. However, after the temporary carrier has been provided, the original substrate 5 is removed, suitably by etching, although methods such as polishing or grinding could be used too.

After the removal of the substrate so as to expose the buffer layer (e.g., AlGaN) 7, a mirror 111 is provided on the buffer layer 7. Suitably an Ag mirror is provided by sputtering. Then, the assembly is glue bonded to a new substrate 112, preferably using any of silicone, epoxy, BCB or other types of polymer 113 as adhesive. Finally, the carrier C is removed.

The same process steps as in the previous embodiment are used to make contacts, wire bonding and the protective "bulb" 105, as shown in FIG. 12.

In a variation of the process just described in connection with FIGS. 11 and 12, the same process is used except that instead of applying/attaching a mirror to the buffer layer, instead the mirror 111 is applied to a new substrate 112. Then the assembly of new substrate and mirror is attached to the buffer layer of the LED array structure by glue bonding. This of course requires that the adhesive is practically fully transparent in order that undue losses will not occur. The adhesive 113 in this case is located between the mirror 111 and the buffer layer 7. In these embodiments, the mirror 91, 111 is used as the support for the nanowires 1 in addition to and/or instead of the substrate 5 and/or buffer layer 7.

While the invention has been described in connection with what is presently considered to be the most practical and preferred embodiments, it is to be understood that the invention is not to be limited to the disclosed embodiments, on the contrary, it is intended to cover various modifications and equivalent arrangements within the scope of the appended claims.

The invention claimed is:

1. A method of manufacturing a nanowire light emitting diode (LED) structure, comprising:
   providing a support layer;
   providing a plurality of devices arranged side by side on the support layer, wherein each device comprises a first conductivity type semiconductor nanowire core and an enclosing second conductivity type semiconductor shell for forming a pn or pin junction that in operation provides an active region for light generation;
   depositing a sacrificial layer that completely covers the devices in a non-active area and partially covers the devices in a LED area, leaving top portions of the devices in the LED area exposed; and
   depositing a first electrode layer on the exposed top portions of the devices and over the support layer between the devices.

2. The method of claim 1, wherein the first conductivity type comprises n-type, the second conductivity type comprises p-type and the first electrode layer comprises a p-electrode layer.

3. The method of claim 2, further comprising depositing a second n-electrode layer which electrically connects to the n-type nanowire cores.

4. The method of claim 3, wherein the support layer comprise an n-type semiconductor buffer layer on a substrate, which buffer layer serves as n-contact and the n-electrode layer contacts the buffer layer.

5. The nanowire method of claim 3, wherein the support layer comprises at least one of a transparent layer, a reflective layer or a semiconductor substrate.

6. The method of claim 4, wherein each device comprises a core-shell nanowire containing the core, the shell and an active layer between the core and the shell.

7. The method of claim 6, further comprising a dielectric masking layer on the support layer such that the cores protrude from the buffer layer through openings in the masking layer, and the shells are located on the masking layer.

8. The method of claim 7, further comprising removing the sacrificial layer such that a first portion of the first electrode layer located on the sacrificial layer in the non-active area is removed and a second portion of the first electrode layer located on top of the nanowire shells forms an air-bridged p-electrode.

9. The method of claim 8, wherein the sacrificial layer comprises a photoresist.

10. The method of claim 4, wherein the buffer layer comprises at least one of gallium nitride or aluminum gallium nitride.

11. The method of claim 2, wherein the p-electrode comprises a transparent conductive oxide layer.

12. The method as claimed in claim 8, further comprising the step of temporary bonding a carrier to the side of the structure comprising the nanowires.

13. The method as claimed in claim 12, further comprising the step of etching one or more recesses in the substrate down to the buffer layer.

14. The method as claimed in claim 13, further comprising forming a mirror on the buffer layer in the at least one recess to render the LED structure top emitting.

15. The method as claimed in claim 14, further comprising filling the at least one recess over the mirror with a filler material and removing the structure from the carrier.

16. The method as claimed in claim 12, further comprising removing the substrate from the structure leaving the buffer layer exposed and applying a mirror to the buffer layer to render the LED structure top emitting.

17. The method as claimed in claim 16, further comprising attaching a carrier to the mirror.

18. The method as claimed in claim 8, further comprising attaching a carrier to the structure, the carrier having a mirror on one surface facing the buffer layer.

* * * * *